United States Patent
Ashida

(10) Patent No.: US 9,337,001 B2
(45) Date of Patent: May 10, 2016

(54) MICROWAVE PROCESSING APPARATUS AND CONTROL METHOD THEREOF

(75) Inventor: Mitsutoshi Ashida, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 790 days.

(21) Appl. No.: 13/591,605

(22) Filed: Aug. 22, 2012

(65) Prior Publication Data

US 2013/0062341 A1   Mar. 14, 2013

(30) Foreign Application Priority Data

Sep. 9, 2011   (JP) ................. 2011-196658

(51) Int. Cl.
*H05B 6/80* (2006.01)
*H05B 6/64* (2006.01)
*H01J 37/32* (2006.01)
*H05H 1/46* (2006.01)

(52) U.S. Cl.
CPC ..... *H01J 37/32192* (2013.01); *H01J 37/32247* (2013.01); *H05H 2001/4682* (2013.01)

(58) Field of Classification Search
CPC ............. H01J 37/32192; H01J 37/32247; H05H 2001/4682
USPC ......... 219/715, 716, 748, 749, 750, 678, 679, 219/690, 695, 696; 118/723 MW, 723 MR, 118/723 ME; 315/111.21; 156/345.36; 422/89

See application file for complete search history.

(56) References Cited

U.S. PATENT DOCUMENTS

| | | | | |
|---|---|---|---|---|
| 6,316,759 | B2 * | 11/2001 | Gaisford | ............ H05B 6/80 219/679 |
| 2007/0167029 | A1 | 7/2007 | Kowalski et al. | |
| 2011/0125148 | A1 * | 5/2011 | Turner | ......... A61B 18/1815 606/33 |
| 2011/0168699 | A1 * | 7/2011 | Oomori et al. | ............ 219/748 |

FOREIGN PATENT DOCUMENTS

| | | |
|---|---|---|
| JP | 2005-259633 | 9/2005 |
| JP | 2007-213814 A | 8/2007 |
| JP | 2009-516375 | 4/2009 |
| JP | 2009-259511 A | 11/2009 |
| JP | 2010-129790 | 6/2010 |

OTHER PUBLICATIONS

Office Action issued Sep. 23, 2013 in Korean Patent Application No. 10-2012-0099334.

\* cited by examiner

*Primary Examiner* — Quang Van
(74) *Attorney, Agent, or Firm* — Oblon, McClelland, Maier & Neustadt, L.L.P.

(57) ABSTRACT

A microwave processing apparatus includes: a processing chamber; a microwave introducing unit for generating microwaves and introducing the microwaves into the chamber; and a control unit for controlling the microwave introducing unit. The microwave introducing unit has microwave sources for generating the microwaves and transmission lines for transmitting the microwaves into the chamber and introduces parts of the microwaves into the chamber simultaneously, and the control unit switches a first state of introducing said parts of the microwaves into the chamber to a second state of generating a microwave by one of the microwave sources and introducing into the chamber.

15 Claims, 5 Drawing Sheets

MICROWAVE PROCESSING APPARATUS AND CONTROL METHOD THEREOF

CROSS-REFERENCE TO RELATED APPLICATION

This application claims priority to Japanese Patent Application No. 2011-196658 filed on Sep. 9, 2011, the entire contents of which are incorporated herein by reference.

FIELD OF THE INVENTION

The present invention relates to a microwave processing apparatus for performing predetermined treatment by introducing a microwave into a processing chamber, and a control method thereof.

BACKGROUND OF THE INVENTION

In a semiconductor device manufacturing process, various heat treatments such as film formation, etching, oxidation/diffusion, modification, annealing and the like are performed on a semiconductor wafer as a substrate to be processed. Such heat treatments are generally performed by heating the semiconductor wafer by using a substrate processing apparatus having a heating lamp or a heater.

However, recently, an apparatus using a microwave instead of a lamp or a heater is known as the apparatus for performing heat treatment on the semiconductor wafer. For example, Japanese Patent Application Publication No. 2009-516375 (JP2009-516375A) describes a heat treatment system for performing hardening, annealing and film formation by using a microwave energy. Further, Japanese Patent Application Publication No. 2010-129790 (JP2010-129790A) describes a heat treatment apparatus for forming a thin film by heating a film forming material by irradiating a microwave to a semiconductor wafer having a film forming material layer formed on a surface thereof. Especially, in the microwave processing apparatus, it is possible to form a thin active layer while suppressing diffusion of impurities or restore a lattice defect.

Japanese Patent Application Publication No. 2005-259633 (JP2005-259633A) describes a microwave plasma discharge processing apparatus having a plurality of magnetron high-frequency oscillators although it is different from the microwave processing apparatus described in JP2009-516375A and JP2010-129790A. Further, JP2005-259633A describes a technique for performing impedance matching in a high-density plasma region between the magnetron high-frequency oscillator and a low-density plasma region where a processing specimen is provided in the microwave plasma discharging processing apparatus.

In the microwave processing apparatus, a magnetron is generally used as a microwave source for generating a microwave. When an output of a single magnetron is insufficient for a large semiconductor wafer having a diameter of about 300 mm or the like, a plurality of magnetrons is provided to introduce a plurality of microwaves into the processing chamber simultaneously.

Meanwhile, in the microwave processing apparatus, e.g., a surface state or a temperature of the semiconductor wafer is changed as the semiconductor wafer is processed, so that an impedance of the processing chamber side is changed. Accordingly, it is preferable to perform impedance matching between the microwave source and the processing chamber even while the semiconductor wafer is being processed. The impedance matching is performed when a power of a reflection wave transmitted from the processing chamber side to the microwave source exceeds a predetermined threshold value, for example.

When a plurality of microwaves is introduced into the processing chamber simultaneously as described above, a microwave generated by another microwave source is introduced between the microwave source and the processing chamber and, thus, it is difficult to detect the reflection wave accurately. In that case, the accuracy of the impedance matching may be inhibited.

JP2009-516375A and JP2010-129790A do not describe a specific method for matching impedance. JP2005-259633A describes a technique for matching impedance in a plasma processing apparatus as described above, but does not describe a method for matching impedance in a microwave processing apparatus other than the plasma processing apparatus.

SUMMARY OF THE INVENTION

In view of the above, the present invention provides a microwave processing apparatus in which a plurality of microwaves generated by a plurality of microwave sources is simultaneously introduced into a processing chamber, capable of improving accuracy of impedance matching between the microwave sources and the processing chamber, and a control method thereof.

In accordance with an aspect of the present invention, there is provided a microwave processing apparatus including: a processing chamber accommodating an object to be processed; a microwave introducing unit for generating microwaves used to process the object and introducing the microwaves into the processing chamber; and a control unit for controlling the microwave introducing unit.

The microwave introducing unit includes a plurality of microwave sources for generating the microwaves and a plurality of transmission lines for transmitting the microwaves generated by the microwave sources into the processing chamber, and is configured to introduce parts of the microwaves into the processing chamber simultaneously.

The control unit is configured to switch a first state in which said parts of the microwaves are simultaneously introduced into the processing chamber to a second state in which a microwave is generated by one of the microwave sources and is introduced into the processing chamber, temporarily and selectively, and to switch the second state to the first state when the second state is completed.

In accordance with another aspect of the present invention, there is provided a control method of controlling the microwave processing apparatus including a processing chamber accommodating an object to be processed and a microwave introducing unit for generating microwaves used to process the object and introducing the microwaves into the processing chamber.

The microwave introducing unit has a plurality of microwave sources for generating the microwaves and a plurality of transmission lines for transmitting the microwaves generated by the microwave sources into the processing chamber so that parts of microwaves are simultaneously introduced into the processing chamber.

The control method includes: switching a first state in which said parts of the microwaves are simultaneously introduced into the processing chamber to a second state in which a microwave is generated by one of the microwave sources and is introduced into the processing chamber, selectively and temporarily; and switching the second state to the first state when the second state is completed.

In the microwave processing apparatus and the control method, the microwave introducing unit may further include a plurality of detectors for detecting reflection waves from the processing chamber on the transmission lines. The first state may be a major state for processing the object, and the second state may be a state for detecting a reflection wave on a transmission line on which the microwave is generated in the second state among the transmission lines.

In this case, the control unit may perform impedance matching between the processing chamber and the microwave source, which generates the microwave in the second state based on a power of the reflection wave detected in the second state. Further, the control unit preferably determines the microwave source, which generates the microwave in the second state, based on powers of the reflection waves detected in the first state. Similarly, the control method may include performing impedance matching between the processing chamber and the microwave source, which generates the microwave in the second state based on a power of the reflection wave detected in the second state. Further, the control method may include determining the microwave source, which generates the microwave in the second state, based on powers of the reflection waves detected in the first state.

Further, in the microwave processing apparatus and the control method, the microwave sources may include a plurality of first microwave sources for alternately repeating a microwave generating state and a microwave non-generating state multiple times in the first state and a plurality of second microwave sources for alternately repeating the microwave generating state and a microwave non-generating state multiple times in the first state while avoiding the simultaneous microwave generations by the first and the second microwave sources.

In this case, the first state may be switched to the second state when the microwave source, which generates the microwave in the second state, is switched from the microwave non-generating state to the microwave generating state in the first state. Further, a duration of the second state is preferably shorter than or equal to a period of time of the microwave generating state in the first state of the microwave source which generates the microwave in the second state, and a duration of the microwave generating state of the microwave source, which generates the microwave in the second state, before and after the switching from the second state to the first state is preferably equal to said period of time.

Further, in the microwave processing apparatus and the method, the microwaves may be irradiated onto the object, thereby processing the object.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, an embodiment of the present invention will be described with reference to the accompanying drawings which form a part hereof.

[Microwave Processing Apparatus]

Figure 1:
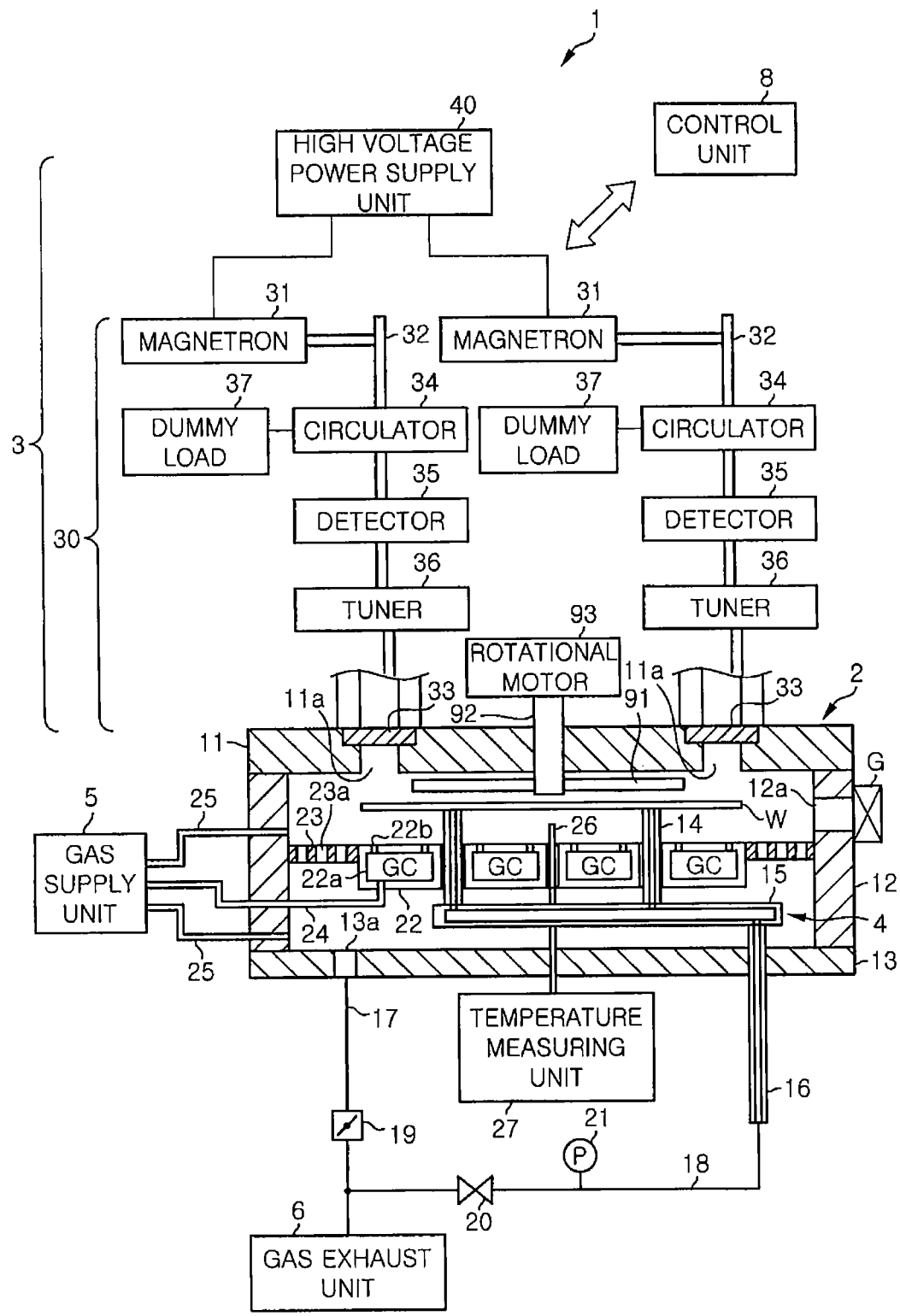
FIG. 1 is a cross sectional view showing a schematic configuration of a microwave processing apparatus in accordance with an embodiment of the present invention.

First, a schematic configuration of a microwave processing apparatus in accordance with an embodiment of the present invention will be described with reference to FIG. 1. FIG. 1 is a cross sectional view showing the schematic configuration of the microwave processing apparatus in accordance with the present embodiment. The microwave processing apparatus 1 in accordance with the present embodiment performs predetermined treatment such as film formation, modification, annealing or the like by irradiating microwaves to a semiconductor wafer W for manufacturing a semiconductor device (hereinafter, referred to as "wafer") through a plurality of continuous operations.

The microwave processing apparatus 1 includes: a processing chamber 2 accommodating a wafer W as a substrate to be processed; a microwave introducing unit 3 for introducing microwaves into the processing chamber 2; a supporting unit 4 for supporting the wafer W in the processing chamber 2; a gas supply unit 5 for supplying a gas into the processing chamber 2; a gas exhaust unit 6 for vacuum-exhausting the processing chamber 2; and a control unit 8 for controlling each component of the microwave processing apparatus 1. As for the unit for supplying a gas into the processing chamber 2, an external gas supply unit that is not included in the microwave processing apparatus 1 may be used instead of the gas supply unit 5.

<Processing Chamber>

The processing chamber 2 is formed in, e.g., a substantially cylindrical shape. The processing chamber 2 is made of metal. As for a material forming the processing chamber 2, e.g., aluminum, aluminum alloy, stainless steel or the like may be used. The processing chamber 2 may also be formed in, e.g., a rectangular column shape, other than a cylindrical shape. The microwave introducing unit 3 is provided on a top portion of the processing chamber 2, and serves as a microwave introducing mechanism for introducing an electromagnetic wave (microwave) into the processing chamber 2. The configuration of the microwave introducing unit 3 will be described later in detail.

The processing chamber 2 has a plate-shaped ceiling portion 11, a plate-shaped bottom portion 13, a sidewall 12 for connecting the ceiling portion 11 and the bottom portion 13, a plurality of microwave inlet ports 11a penetrating through the ceiling portion 11 vertically, a loading/unloading port 12a provided at the sidewall 12, and a gas exhaust port 13a provided at the bottom portion 13. The loading/unloading port 12a allows the wafer W to be loaded and unloaded between the processing chamber 2 and a transfer chamber (not shown) adjacent thereto. A gate valve G is provided between the processing chamber 2 and the transfer chamber (not shown).

The gate valve G has a function of opening and closing the loading/unloading port 12a. The gate valve G in a closed state airtightly seals the processing chamber, and the gate valve G in an open state allows the wafer W to be transferred between the processing chamber 2 and the transfer chamber (not shown).

<Supporting Unit>

The supporting unit 4 includes a plate-shaped hollow lift plate 15 provided in the processing chamber 2, a plurality of pipe-shaped supporting pins 14 extending upward from the top surface of the lift plate 15, and a pipe-shaped shaft 16 extending from the bottom surface of the lift plate 15 to the outside of the processing chamber 2 while penetrating the bottom portion 13. The shaft 16 is fixed to an actuator (not shown) outside the processing chamber 2.

The plurality of supporting pins 14 supports the wafer W while being in contact with the wafer W in the processing chamber 2. The upper end portions of the supporting pins 14 are disposed in parallel along the circumferential direction of the wafer W. The supporting pins 14, the lift plate 15 and the shaft 16 are configured to vertically move the wafer W by using the actuator (not shown).

The supporting pins 14, the lift plate 15 and the shaft 16 are configured to allow the wafer W to be adsorbed onto the supporting pins 14 by the gas exhaust unit 6. Specifically, each of the supporting pins 14 and the shaft 16 has a pipe shape communicating with the inner space of the lift plate 15. Further, suction openings for sucking the rear surface of the wafer W are formed at the upper end portions of the supporting pins 14.

The supporting pins 14 and the lift plate 15 are made of a dielectric material. The supporting pins 14 and the lift plate 15 may also be made of, e.g., quartz, ceramic or the like.

<Gas Exhaust Unit>

The microwave processing apparatus 1 further includes a gas exhaust line 17 for connecting the gas exhaust port 13a and the gas exhaust unit 6, a gas exhaust line 18 for connecting the shaft 16 and the gas exhaust line 17, a pressure control valve 19 provided on the gas exhaust line 17, and an opening/closing valve 20 and a pressure gauge 21 provided on the gas exhaust line 18. The gas exhaust line 18 is directly or indirectly connected to the shaft 16 so as to communicate with the inner space of the shaft 16. The pressure control valve 19 is provided between the gas exhaust port 13a and the connection node between the gas exhaust lines 17 and 18.

The gas exhaust unit 6 has a vacuum pump such as a dry pump or the like. By operating the vacuum pump of the gas exhaust unit 6, the inside of the processing chamber 2 is vacuum-evacuated. At this time, the opening/closing valve 20 opens, so that the wafer W can be fixed by the supporting pins 14 by suction on the backside thereof.

<Gas Introducing Unit>

The microwave processing apparatus 1 further includes: a shower head 22 disposed below the portion where the wafer W will be located in the processing chamber 2, an annular rectifying plate 23 disposed between the shower head 22 and the sidewall 12; a line 24 for connecting the shower head 22 and the gas supply unit 5; and a plurality of lines 25 connected to the gas supply unit 5 for introducing a processing gas into the processing chamber 2.

The shower head 22 cools the wafer W by a cooling gas in the case of processing the wafer W at a relatively low temperature. The shower head 22 includes: a gas channel (GC) 22a communicating with the line 24; and a plurality of gas injection openings 22b, communicating with the gas channel 22a, for injecting a cooling gas toward the wafer W. In the example shown in FIG. 1, the gas injection openings 22b are formed at a top surface of the shower head 22. The shower head 22 is made of a dielectric material having a low dielectric constant. The shower head 22 may be made of, e.g., quartz, ceramic or the like. The shower head 22 is not necessary for the microwave processing apparatus 1 and thus can be omitted.

The rectifying plate 23 has a plurality of rectifying openings 23a penetrating therethrough in a vertical direction. The rectifying plate 23 rectifies an atmosphere of the region where the wafer W will be placed in the processing chamber 2 and allows it to flow toward the gas exhaust port 13a.

The gas supply unit 5 is configured to supply a processing gas or a cooling gas, e.g., $N_2$, Ar, He, Ne, $O_2$, $H_2$, or the like. When the microwave processing apparatus 1 performs film formation, the gas supply unit 5 supplies a film forming material gas into the processing chamber 2.

Although it is not shown, the microwave processing apparatus 1 includes mass flow controllers and opening/closing valves provided on the lines 24 and 25. The types of gases supplied to the shower head 22 and the processing chamber 2 or the flow rates thereof are controlled by the mass flow controllers and the opening/closing valves.

<Temperature Measuring Unit>

The microwave processing apparatus 1 further includes a plurality of radiation thermometers 26 for measuring a surface temperature of the wafer W and a temperature measuring unit 27 connected to the radiation thermometers 26. In FIG. 1, the illustration of the radiation thermometers 26 except the radiation thermometer 26 for measuring a surface temperature of a central portion of the wafer W is omitted. The radiation thermometers 26 are extended from the bottom portion 13 to the portion where the wafer W will be located such that the upper end portions thereof are positioned close to the rear surface of the wafer W.

<Microwave Stirring Unit>

The microwave processing apparatus 1 further includes: a stirrer fan 91 disposed above the portion where the wafer W will be located in the processing chamber 2, formed of a plurality of fans; a rotational motor 93 provided outside the processing chamber 2; and a rotational shaft 92 for connecting the stirrer fan 91 and the rotational motor 93 while penetrating the ceiling portion 11. The stirring fan 91 is rotated to reflect and stir the microwaves introduced into the processing chamber 2. The stirring fan 91 has, e.g., four fans. The stirring fan 91 is made of a dielectric material having a low dielectric loss tangent (tan δ) in order to prevent the microwaves colliding with the stirring fan 91 from being absorbed or being transformed into a heat. The stirring fan 91 can be made of, e.g., a complex ceramics formed of metal or lead zirconate titanate (PZT), quartz, sapphire, or the like. Besides, the position of the stirring fan 91 is not limited to that shown in FIG. 1. For example, the stirring fan 91 can be provided below the portion where the wafer W will be located.

<Control Unit>

Figure 5:
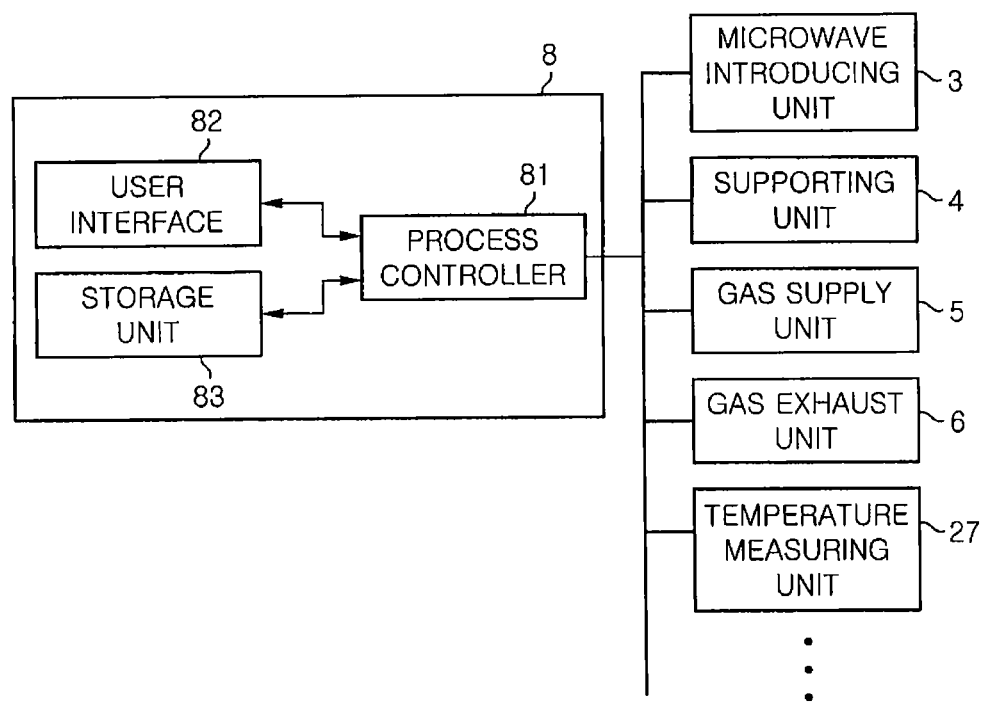
FIG. 5 is an explanatory view showing a configuration of a control unit shown in FIG. 1.

Each component of the microwave processing apparatus is connected to and controlled by the control unit 8. The control unit 8 is typically a computer. FIG. 5 illustrates the configuration of the control unit 8 shown in FIG. 1. In the example shown in FIG. 5, the control unit 8 includes a process controller 81 having a CPU, a user interface 82 and a storage unit 83 connected to the process controller 81.

The process controller 81 integrally controls the components of the microwave processing apparatus 1 (e.g., the microwave introducing unit 3, the supporting unit 4, the gas supply unit 5, the gas exhaust unit 6 and the temperature measuring unit 27 and the like) which relate to the processing conditions such as a temperature, a pressure, a gas flow rate, an output of a microwave and the like.

The user interface 82 includes a keyboard or a touch panel through which a process manager inputs commands to manage the microwave processing apparatus 1, a display for displaying an operation status of the microwave processing apparatus 1, or the like.

The storage unit 83 stores therein programs (software) for implementing various processes performed by the microwave processing apparatus 1 under the control of the process controller 81, and recipes in which processing condition data and the like are recorded. The process controller 81 executes a control programs or a recipe retrieved from the storage unit 83 in response to an instruction from the user interface 82 when necessary. Accordingly, a desired process is performed in the processing chamber 2 of the microwave processing apparatus 1 under the control of the process controller 81.

The control programs and the recipes may be stored in a computer-readable storage medium, e.g., a CD-ROM, a hard disk, a flexible disk, a flash memory, a DVD, a Blu-ray disc, or the like. Further, the recipes may be transmitted on-line from another device via, e.g., a dedicated line, whenever necessary.

<Microwave Introducing Unit>

Figure 2:
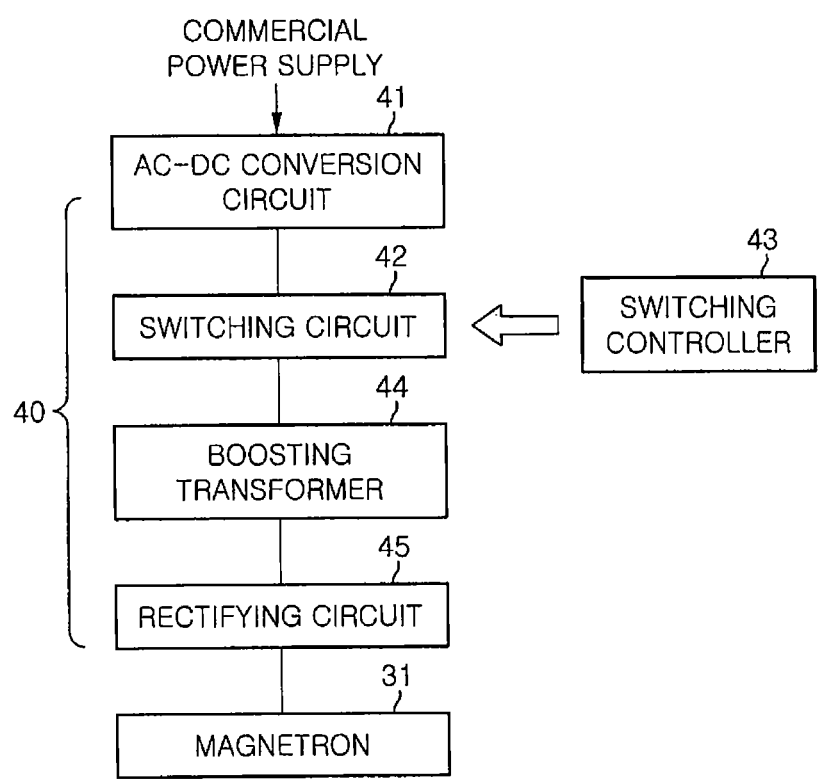
FIG. 2 is an explanatory view showing a schematic configuration of a high voltage power supply unit of a microwave introducing unit in accordance with an embodiment of the present invention.
Figure 3:
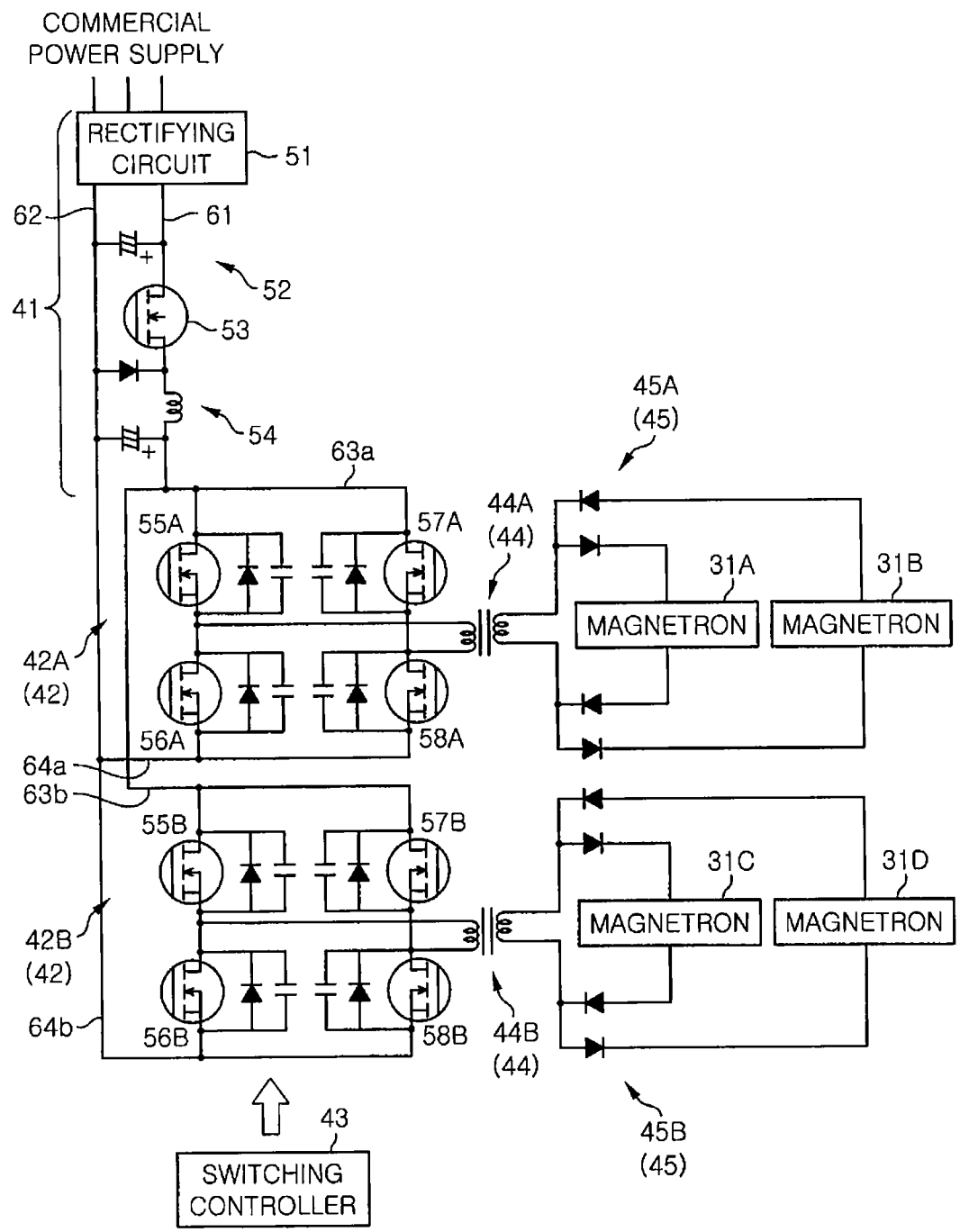
FIG. 3 is a circuit diagram showing an example of a circuit configuration of the high voltage power supply unit of the microwave introduction unit in accordance with an embodiment of the present invention.
Figure 4:
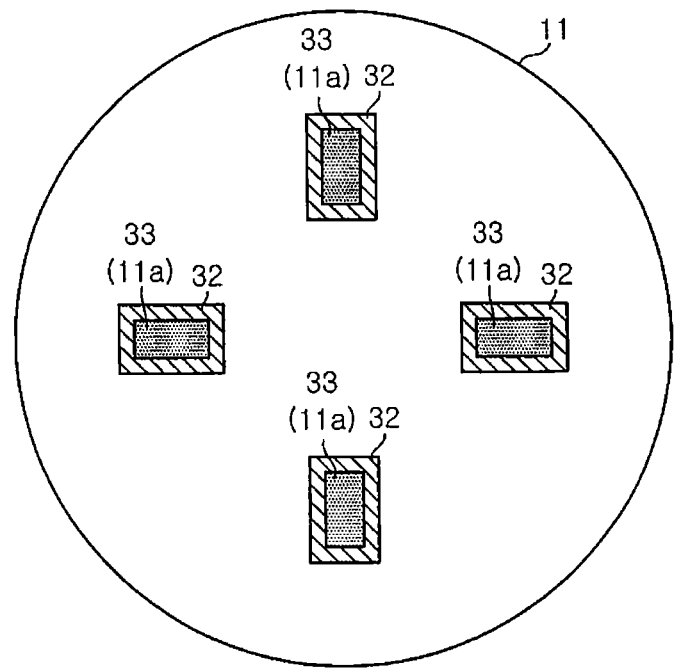
FIG. 4 is a plane view showing a top surface of a ceiling portion of the processing chamber shown in FIG. 1.

Hereinafter, the configuration of the microwave introducing unit 3 will be described in detail with reference to FIGS. 1 to 4. FIG. 2 is an explanatory view showing a schematic configuration of a high voltage power supply unit of the microwave introducing unit 3. FIG. 3 is a circuit diagram showing an example of a circuit configuration of the high voltage power supply unit of the microwave introducing unit 3. FIG. 4 is a plane view showing a top surface of the ceiling portion 11 of the processing chamber 2 shown in FIG. 1.

As described above, the microwave introducing unit 3 is provided at a top portion of the processing chamber 2, and serves as a microwave introducing mechanism for introducing electromagnetic waves (microwaves) into the processing chamber 2. As shown in FIG. 1, the microwave introducing unit 3 includes a plurality of microwave units 30 for introducing microwaves into the processing chamber 2 and a high voltage power supply unit 40 connected to the microwave units 30.

(Microwave Unit)

In the present embodiment, the microwave units 30 have the same configuration. Each of the microwave units 30 includes a magnetron 31 for generating microwaves for processing the wafer W, a waveguide 32 for transferring the microwaves generated by the magnetron 31 to the processing chamber 2, a transmission window 33 fixed at the ceiling portion 11 to block the microwave inlet port 11a. The magnetron 31 corresponds to a microwave source in accordance with the embodiment of the present invention, and the waveguide 32 corresponds to the transmission line in accordance with the embodiment of the present invention.

As shown in FIG. 4, in the present embodiment, the processing chamber 2 includes, e.g., four microwave inlet ports 11a spaced apart from each other at a regular interval along the circumferential direction of the ceiling unit 11. In the present embodiment, the number of the microwave units 30 is, e.g., four. Hereinafter, reference numerals 31A, 31B, 31C and 31D are used to refer the magnetrons 31 of the four microwave units 3. In FIG. 4, upper, lower, left and right microwave inlet ports 11a introduce microwaves generated by, e.g., the magnetrons 31A to 31D, into the processing chamber 2, respectively.

As for the magnetron 31, one capable of oscillating microwaves of various frequencies can be used. The optimum frequency of the microwave generated by the magnetron 31 is selected depending on types of processing of the wafer W as an object to be processed. For example, in an annealing process, the microwave of a high frequency such as 2.45 GHz, 5.8 GHz or the like is preferably used, and the microwave of 5.8 GHz is more preferably used.

The waveguide 32 is formed in a tubular shape having a rectangular or an annular cross section, and extends upward from the top surface of the ceiling portion 11 of the processing chamber 2. The magnetron 31 is connected to the vicinity of the top end portion of the waveguide 32. The bottom end portion of the waveguide 32 is brought into contact with the top surface of the transmission window 33. The microwave generated by the magnetron 31 is introduced into the processing chamber 2 through the waveguide 32 and the transmission window 33.

The transmission window 33 is made of dielectric material, e.g., quartz, ceramics, or the like.

The microwave unit 30 further includes a circulator 34, a detector 35 and a tuner 36 which are disposed on the waveguide 32, and a dummy load 37 connected to the circulator 34. The circulator 34, the detector 35 and the tuner 36 are arranged in that order from the top end portion of the waveguide. The circulator 34 and the dummy load 37 form an isolator for isolating reflection waves from the processing chamber 2. In other words, the circulator 34 transmits the reflection waves from the processing chamber 2 to the dummy load 37, and the dummy load 37 transforms the reflection waves transmitted from the circulator 34 into a heat.

The detector 35 detects the reflection wave from the processing chamber 2 on the waveguide 32. The detector 35 is, e.g., an impedance monitor. Specifically, the detector 35 is formed by a standing wave monitor for detecting an electric field of a standing wave on the wave guide 32. The standing wave monitor can be formed by, e.g., three pins projecting into the inner space of the waveguide 32. The reflection wave from the processing chamber 2 can be detected by detecting the location, phase and intensity of the electric field of the standing wave by using the standing wave monitor. Further, the detector 35 may be formed by a directional coupler capable of detecting a traveling wave and a reflection wave.

The tuner 36 performs matching between the magnetron 31 and the processing chamber 2. The tuner 36 includes, e.g., a conductive plate that can be inserted into and removed from the waveguide 32. In this case, the impedance between the magnetron 31 and the processing chamber 2 can be controlled by adjusting the power of the reflection wave by controlling the projecting amount of the conductive plate into the inner space of the waveguide 32. The sequence of the impedance matching between the magnetron 31 and the processing chamber 2 by using the tuner 36 will be described later in detail.

(High Voltage Power Supply Unit)

The high voltage power supply unit 40 supplies a high voltage to the magnetron 31 for generating a microwave. As shown in FIG. 2, the high voltage power supply unit 40 includes an AC-DC conversion circuit 41 connected to a commercial power supply, a switching circuit 42 connected to the AC-DC conversion circuit 41, a switching controller 43 for controlling an operation of the switching circuit 42, a boosting transformer 44 connected to the switching circuit 42, and a rectifying circuit 45 connected to the boosting transformer 44. The magnetron 31 is connected to the boosting transformer 44 via the rectifying circuit 45.

The AC-DC conversion circuit 41 rectifies an AC (e.g., three phase 200V AC) supplied from the commercial power supply and converting it to a DC having a predetermined waveform. The switching circuit 42 controls on/off of the DC converted by the AC-DC conversion circuit 41. In the switching circuit 42, the switching controller 43 performs phase-shift PWM (pulse width modulation) control or PAM (pulse amplitude modulation) control, thereby generating a pulsed voltage waveform. The boosting transformer 44 boosts the voltage waveform outputted from the switching circuit 42 to a predetermined level. The rectifying circuit 45 rectifies the voltage boosted by the boosting transformer 44 and supplies the rectified voltage to the magnetron 31.

Hereinafter, an example of the configuration of the high voltage power supply unit 40 in a case where the microwave introducing unit 3 includes four microwave units 30 (magnetrons 31) will be described with reference to FIG. 3. In this example, the high voltage power supply unit 40 includes a single AC-DC conversion circuit 41, two switching circuits 42A and 42B, a single switching controller 43, two boosting transformers 44A and 44B, and two rectifying circuits 45A and 45B.

The AC-DC conversion circuit 41 includes: a rectifying circuit 51 connected to the commercial power supply; a smoothing circuit 52 connected to the rectifying circuit 51; a smoothing circuit 54 connected to the switching circuit 42; and a power FET 53, provided between the smoothing circuits 52 and 54, for improving a power factor. The rectifying circuit 51 has two output ends. The smoothing circuit 52 is formed by a capacitor provided between two wires 61 and 62 connected to the two output ends of the rectifying circuit 51. The power FET 53 is disposed on the wire 61. The rectifying circuit 54 has a coil disposed on the wire 61 and a capacitor provided between the wires 61 and 62.

The switching circuit 42A controls on/off of the DC converted by the AC-DC conversion circuit 41 and outputs a positive current and a negative current to the boosting transformer 44A by generating a pulsed voltage waveform. The switching circuit 42A has four switching transistors 55A, 56A, 57A and 58A forming a full bridge circuit (also referred to as "H-bridge"). The switching transistors 55A and 56A are connected in series and disposed between a wire 63a connected to the wire 61 and a wire 64a connected to the wire 62. The switching transistors 57A and 58A are connected in series and disposed between the wires 63a and 64a. The switching circuit 42A further has resonant capacitors connected in parallel to the switching transistors 55A to 58A, respectively.

In the same manner, the switching circuit 42B controls an on/off operation of the DC converted by the AC-DC conversion circuit 41 and outputs a positive current and a negative current to the boosting transformer 44B by generating a pulsed voltage waveform. The switching circuit 42B has four switching transistors 55B, 56B, 57B and 58B forming a full bridge circuit. The switching transistors 55B and 56B are connected in series and disposed between a wire 63b connected to the wire 61 and a wire 64b connected to the wire 62. The switching transistors 57B and 58B are connected in series and disposed between the wires 63b and 64b. The switching circuit 42B further has resonant capacitors connected in parallel to the switching transistors 55B to 58B, respectively.

In view of efficiency, an FET (Field Effect Transistor) can be used for the switching transistors 55A to 58A and 55B to 58B. As for the FET used for the switching transistors 55A to 58A and 55B to 58B, it is preferable to use a MOSFET, and more preferably to use a power MOSFET. Further, instead of the MOSFET, it is also possible to use an IGBT (Insulated Gate Bipolar Transistor) having a higher withstanding voltage than the MOSFET and suitable for high power.

The boosting transformer 44A has two input terminals and two output terminals. One of the two input terminals of the boosting transformer 44A is connected between the switching transistors 55A and 56A, and the other input terminal is connected between the switching transistors 57A and 58A. In the same manner, the boosting transformer 44B has two input terminals and two output terminals. One of the two input terminals of the boosting transformer 44B is connected between the switching transistors 55B and 56B, and the other input terminal is connected between the switching transistors 57B and 58B.

The rectifying circuit 45A includes two diodes connected to one of the two output terminals of the boosting transformer 44A and two diodes connected to the other output terminal thereof. The magnetron 31A is connected to the boosting transformer 44A through two diodes respectively connected to the two output terminals of the boosting transformer 44A. The magnetron 31B is connected to the boosting transformer 44A through other two diodes respectively connected to the two output terminals of the boosting transformer 44A. The four diodes of the rectifying circuit 45A are arranged such that the direction of the current flowing from the boosting transformer 44A toward the magnetron 31A becomes opposite to the direction of the current flowing from the boosting transformer 44A toward the magnetron 31B.

In the same manner, the rectifying circuit 45B includes two diodes connected to one of the two output terminals of the boosting transformer 44B and two diodes connected to the other output terminal thereof. The magnetron 31C is connected to the boosting transformer 44B through two diodes respectively connected to the two output terminals of the boosting transformer 44B. The magnetron 31D is connected to the boosting transformer 44B through the other two diodes respectively connected to the two output terminals of the boosting transformer 44B. The four diodes of the rectifying circuit 45B are arranged such that the direction of the current flowing from the boosting transformer 44B toward the magnetron 31C becomes opposite to the direction of the current flowing from the boosting transformer 44B toward the magnetron 31D.

[Processing Sequence]

Hereinafter, the sequence of processes performed in the microwave processing apparatus 1 in the case of performing, e.g., an annealing process, on the wafer W will be described. First, a command is inputted from the user interface 82 to the process controller 81 so that an annealing process can be performed by the microwave processing apparatus 1. Next, the process controller 81 receives the command and retrieves a recipe stored in the storage unit 83 or a computer-readable storage medium. Then, the process controller 81 transmits control signals to the end devices of the microwave processing apparatus 1 (e.g., the microwave introducing unit 3, the supporting unit 4, the gas supply unit 5, the gas exhaust unit 6 and the like) so that the annealing process can be performed under the conditions based on the recipe.

Thereafter, the gate valve G is opened, and the wafer W is loaded into the processing chamber 2 through the gate valve G and the loading/unloading port 12a by a transfer unit (not shown). The wafer W is mounted on the supporting pins 14. Then, the gate valve G is closed, and the processing chamber 2 is vacuum-evacuated by the gas exhaust unit 6. At this time, the opening/closing valve 20 is opened, so that the wafer W can be adsorptively fixed on the supporting pins 44 by attracting the rear surface thereof. Then, the predetermined amounts of the processing gas and the cooling gas are introduced by the gas supply unit 5. The inner space of the processing chamber 2 is controlled at a specific pressure by controlling the gas exhaust amount and the gas supply amount.

Next, a microwave is generated by applying a voltage from the high voltage power supply unit 40 to the magnetron 31. The microwave generated by the magnetron 31 passes through the waveguide 32 and the transmission window 33 and then is introduced into the space above the wafer W in the processing chamber 2. In this embodiment, a plurality of microwaves is generated by a multiplicity of magnetrons 31 and is introduced into the processing chamber 2 at the same time. The method for generating a plurality of microwaves at the same time by the plurality of microwaves 31 will be described in detail later.

The microwaves introduced into the processing chamber 2 is irradiated onto the surface of the wafer W, so that the wafer W is rapidly heated by electromagnetic wave heating such as joule heating, magnetic heating, induction heating or the like. As a result, the wafer W is annealed.

When the process controller 81 transmits a control signal to each end device of the microwave processing apparatus 1 to complete the plasma processing, the generation of the microwave is stopped and, also, the supply of the processing gas and the cooling gas is stopped. Thus, the annealing process for the wafer W is completed. Thereafter, the gate valve G is opened, and the wafer W is unloaded by the transfer unit (not shown).

<Method for Generating a Microwave>

A method for generating a plurality of microwaves simultaneously by a plurality of magnetrons 31 will be described in detail with reference to FIG. 3. In the switching circuits 42A and 42B, a phase shift PWM control or a PAM control is performed by the switching controller 43, thereby generating a pulsed voltage waveform. In the case of the phase shift PWM control, the switching controller 43 inputs phase-controlled gate drive signals to the switching transistors 55A to 58A and 55B to 58B. The switching circuits 42A and 42B generates the pulsed voltage waveform by using such signals.

When gate drive signals are inputted to the switching transistors 55A and 58A, a voltage waveform is generated in a positive direction (direction in which a voltage is increased) when seen from the boosting transformer 44A and, at the same time, a current flows in a direction (positive direction) passing the switching transistor 55A, the boosting transformer 44A and the switching transistor 58A in that order. Accordingly, a current is generated at a secondary side (output terminal side) of the boosting transformer 44A in a direction passing the magnetron 31A. Further, the boosting transformer 44A boosts the voltage of the secondary side (output terminal side) of the boosting transformer 44A to be a predetermined level. In this manner, a high voltage for generating a microwave is supplied to the magnetron 31A, and a microwave is generated by the magnetron 31A.

When gate drive signals are inputted to the switching transistors 56A and 57A, a voltage waveform is generated in a negative direction (direction in which a voltage is decreased) when seen from the boosting transformer 44A and, at the same time, a current flows in a direction (negative direction) passing the switching transistor 57A, the boosting transformer 44A and the switching transistor 56A in that order. As a consequence, a current is generated at a secondary side of the boosting transformer 44A in a direction passing the magnetron 31B. Moreover, the boosting transformer 44A boosts the voltage of the secondary side of the boosting transformer 44A to be a predetermined level. In this manner, a high voltage for generating a microwave is supplied to the magnetron 31B, and a microwave is generated by the magnetron 31B.

When gate drive signals are inputted to the switching transistors 55B and 58B, a voltage waveform is generated in a positive direction when seen from the boosting transformer 44B and, at the same time, a current flows in a direction (positive direction) passing the switching transistor 55B, the boosting transformer 44B and the switching transistor 58B in that order. Accordingly, a current is generated at a secondary side of the boosting transformer 44B in a direction passing the magnetron 31C. Further, the boosting transformer 44B boosts the voltage of the secondary side of the boosting transformer 44B to be a predetermined level. In this manner, a high voltage for generating a microwave is supplied to the magnetron 31C, and a microwave is generated by the magnetron 31C.

When gate drive signals are inputted to the switching transistors 56B and 57B, a voltage waveform is generated in a negative direction when seen from the boosting transformer 44B and, at the same time, a current flows in a direction (negative direction) passing the switching transistor 57B, the boosting transformer 44B and the switching transistor 56B in that order. Hence, a current is generated at a secondary side of the boosting transformer 44B in a direction passing the magnetron 31D. Further, the boosting transformer 44B boosts the voltage of the secondary side of the boosting transformer 44B to be a predetermined level. In this manner, a high voltage for generating a microwave is supplied to the magnetron 31D, and a microwave is generated by the magnetron 31D.

In the present embodiment, the switching controller 43 controls the switching circuits 42A and 42B so that pulsed microwaves are generated by the magnetrons 31A to 31D. In other words, the switching controller 43 controls the switching circuits 42A and 42B (switching transistors 55A, 58A, 55B and 58B) so that a state in which microwaves are generated by the magnetrons 31A and 31C and a state in which microwaves are not generated by the magnetrons 31A and 31C are repeated multiple times. In addition, the switching controller 43 controls the switching circuits 42A and 42B (switching transistors 56A, 57A, 56B and 57B) such that a state in which microwaves are generated by the magnetrons 31B and 31D and a state in which microwaves are not generated by the magnetrons 31B and 31D are repeated multiple times in order to prevent the generation of the microwaves by the magnetrons 31A and 31C from being overlapped with the generation of the microwaves by the magnetrons 31B and 31D.

As a result, two microwaves are generated from the magnetrons 31A to 31D and introduced into the processing chamber 2 at the same time. Further, the switching controller 43 is controlled by the process controller 81 in the controller 8 which is a higher controller. Herein, the magnetrons 31A and 31C correspond to first microwave sources in accordance with the embodiment of the present invention, and the magnetrons 31B and 31D correspond to second microwave sources in accordance with the embodiment of the present invention.

<Impedance Matching Sequence>

Figure 6:
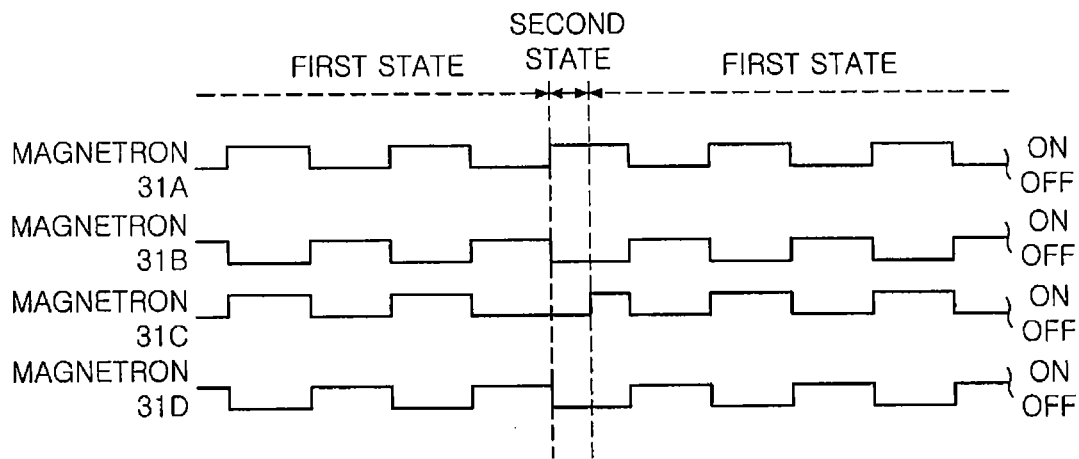
FIG. 6 explains multiple alternate repetition of a state in which a microwave is generated and a state in which a microwave is not generated.

Hereinafter, a sequence of impedance matching between the magnetrons 31 and the processing chamber 2 by using the tuner 36 will be described with reference to FIGS. 6 and 7. The following includes description of a control method of the microwave processing apparatus of the present invention. FIG. 6 illustrates multiple alternate repetitions of states in which microwaves are generated by the respective magnetrons 31A to 31D and states in which microwaves are not generated thereby. In FIG. 6, "ON" indicates the state in which the microwave is generated by each magnetron 31, and "OFF" indicates the state in which the microwave is not generated by each magnetron 31. Hereinafter, the state in which the microwave is generated by each magnetron 31 is set to the "ON" state, and the state in which the microwave is not generated by each magnetron 31 is set to the "OFF" state.

Further, in FIG. 6, a "first state" indicates a state in which two microwaves are simultaneously introduced into the processing chamber 2, and a "second state" indicates a state in which a microwave is selectively and temporarily generated by one (the magnetron 31A in FIG. 6) of the four magnetrons 31A to 31D and only the microwave is introduced into the processing chamber 2 during the second state. FIG. 7 is a flowchart showing an example of a sequence for matching impedances between the magnetrons 31 and the processing chamber 2.

Figure 7:
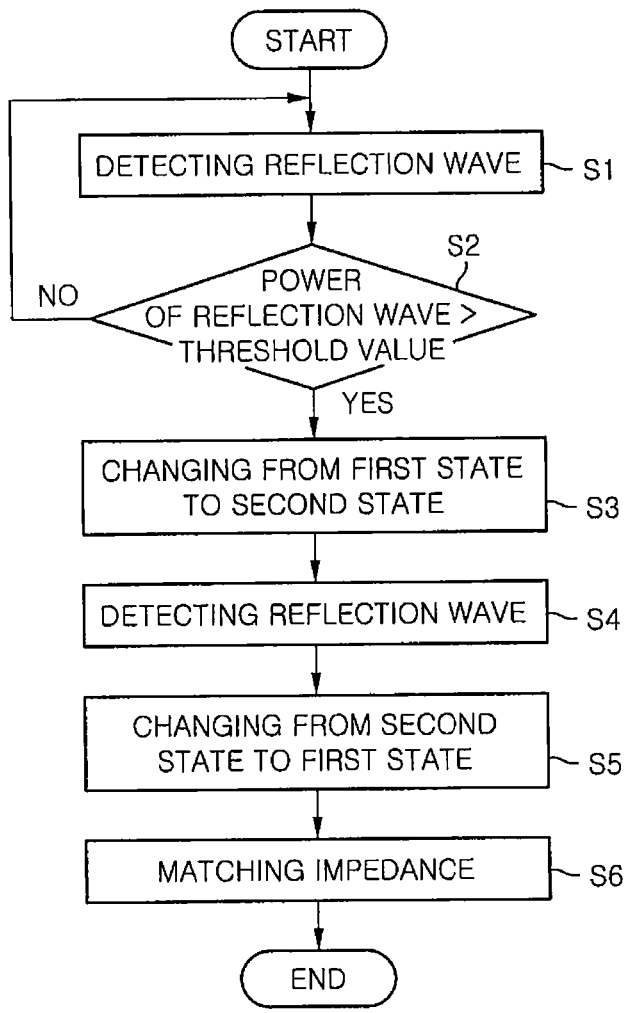
FIG. 7 is a flowchart showing an example of a process of performing impedance matching between a magnetron and a processing chamber.

As shown in FIG. 7, the impedance matching sequence includes a first step S1 to a sixth step S6. The first step S1, the second step S2, the third step S3 and the sixth step S6 are executed during the first state shown in FIG. 6.

In the first step S1, reflection waves from the processing chamber 2 are detected on the waveguides 32 by the detectors 35. The reflection waves are detected on the respective four waveguides 32 connected to the four magnetrons 31A to 31D. In the first step S1, a composite wave of the reflection wave based on the microwave generated by the magnetron 31 connected to the corresponding waveguide and the travelling waves based on the microwaves generated by other magnetrons 31 is detected as a reflection wave from the processing chamber 2.

In the second step S2, it is determined whether or not the power of the reflection wave detected by the detector 35 is higher than a predetermined threshold value. This threshold value is used to determine whether or not the impedance at the processing chamber side when seen from each magnetron 31 is changed over a tolerance range. The threshold value is preset and can be stored as a part of recipe in, e.g., the memory 83 of the controller 8. In the second step S2, as the magnetron 31 which is an impedance matching target, the magnetron 31 to generate a microwave in the second state (hereinafter, simply referred to as "magnetron 31 as an impedance matching target") is determined.

If the power of the reflection wave is equal to or less than the predetermined threshold value (No) in the second step S2, the process returns to the first step S1. If the power of the reflection wave is greater than the predetermined threshold value (Yes) in the second step S2, the process proceeds to the third step S3. In FIG. 6, it is assumed that the power of the reflection wave of the magnetron 31A is determined to be greater than the predetermined threshold value (Yes) in the second step S2. As described above, in the first step S1, the composite wave of the reflection wave and the travelling wave is detected as a reflection wave from the processing chamber 2. Since, however, a ratio of the reflection wave in the composite wave is higher than that of the travelling wave, the determination in the second step is not affected.

In the step S3, the state in which the microwave is introduced into the processing chamber 2 is changed from the first state in which two microwaves are simultaneously introduced into the processing chamber 2 to the second state in which a microwave is generated by the magnetron 31 as the impedance matching target (the magnetron 31A in FIG. 6) and is introduced into the processing chamber 2 in the third step S3.

The switching from the first state to the second state is carried out when the magnetron 31 as the impedance matching target is switched from the off state to the on state in the first state. In the example shown in FIG. 6, the switching from the first state to the second state is carried out when the magnetron 31A is switched from the off state to the on state in the first state. When the first state is switched to the second state, microwaves are not generated by the magnetrons 31B to 31D except the magnetron 31A. At this time, the magnetrons 31B and 31D are switched from the on state to the off state. If the first state is continued, the magnetron 31C is switched from the off stat to the on state. Since, however, the first state is switched to the second state, the magnetron 31C maintains the off state.

In the fourth step S4, the detector 35 detects the reflection wave from the processing chamber 2 on the waveguide 32 connected to the magnetron 31 as an impedance matching target. Since the microwave is generated only by the magnetron 31 as an impedance matching target, it is possible to detect the reflection wave on the waveguide 32 between the processing chamber 2 and the magnetron 31 as impedance matching target without being affected by the travelling wave. Further, whether the state in which the microwave is introduced into the processing chamber 2 corresponds to the first state or the second state, i.e., corresponds to the first step S1 or the fourth step S4 can be determined by, e.g., the power of the travelling wave on each waveguide 32.

In the fifth step S5, the state in which the microwave is introduced into the processing chamber 2 is switched from the second state to the first state when the reflection wave detection in the fourth step S4 is completed. The duration of the second state is preferably shorter than a period of time of the state in which the magnetron 31 as an impedance matching target generates the microwave in the first state is continued. Further, the duration of the state in which the magnetron 31 as an impedance matching target continues the generation of the microwave before and after the switching from the second state to the first state is preferably equal to the above-described period of time.

In the example shown in FIG. 6, e.g., the period of time of the state in which the magnetron 31A as an impedance matching target generates the microwave in the first state is, e.g., about 20 ms, and the period of time in which the second state is continued is, e.g., about 10 ms. In that case, the period of time in which the magnetron 31C continues the generation of the microwave after the switching from the second state to the first state is about 10 ms.

In the sixth step S6, the impedance between the processing chamber 2 and the magnetron 31 as an impedance matching target is matched by using the tuner 36. When the tuner 36 is formed by the aforementioned conductive plate, the impedance matching is performed by controlling the projecting amount of the conductive plate to the inner space of the waveguide 32.

The first step S1, the fourth step S4 and the sixth step S6 are executed by, e.g., a control program implemented for performing the impedance matching. Further, the second step S2, the third step S3 and the fifth step S5 are executed by, e.g., a control program created for controlling driving of the magnetrons 31. The first step S1 to the sixth step S6 can be carried out by executing the above-described two programs together by the process controller 81 of the controller 8.

The first state is a major state for processing the wafer W. If the frequency in which the first state is switched to the second state is increased, the processing efficiency for the wafer W may be deteriorated. Thus, it is preferable to prevent the deterioration of the processing efficiency for the wafer W by limiting the frequency of the second step S2 to be predetermined times by the control program such that the interval of switching to the second state is increased.

Hereinafter, the effects of the microwave processing apparatus 1 in accordance with the present embodiment and the control method thereof will be described. In the present embodiment, the first state in which a plurality of microwaves is simultaneously introduced into the processing chamber 2 is selectively and temporarily switched to the second state in which the microwave is generated by one of the magnetrons 31 and introduced into the processing chamber during the first state. That is, the first state is temporarily switched to the second state, and the second state is returned to the first state when it is completed.

In the present embodiment, only the magnetron 31 as an impedance matching target can generate a microwave in the second state. Therefore, in accordance with the present embodiment, the reflection wave on the waveguide 32 between the processing chamber 2 and the magnetron 31 as the impedance matching target can be detected accurately without being affected by the travelling wave. Especially, in the present embodiment, the impedance matching between the processing chamber 2 and the magnetron 31 that has generated the microwaves in the second state is performed based on the power of the reflection wave detected at the second state. Hence, in accordance with the present embodiment, the accuracy of the impedance matching between a plurality of magnetrons 31 and the processing chamber 2 can be improved.

In the present embodiment, the first state is a major state for processing the wafer W. Further, the second state is for detecting the reflection wave on the waveguide 32 transmitting the microwave generated in the second state among a plurality of waveguides 32. As described above, the first state is selectively and temporarily switched to the second state while the first state is being continued. Therefore, in accordance with the present embodiment, the reflection wave on the waveguide 32 for transferring the microwave can be accurately detected during the processing of the wafer W, and the impedance between the plurality of magnetrons 31 and the processing chamber 2 can be matched individually.

In the present embodiment, the magnetron 31 for generating the microwave in the second state is determined based on the power of the reflection wave detected in the first state. Specifically, the magnetron 31 for generating the microwave in the second state is determined based on whether or not the power of the reflection wave detected in the first state is higher than a predetermined threshold value. Therefore, in accordance with this embodiment, the magnetron 31 whose impedance is matched with that of the processing chamber 2 can be determined during the processing on the wafer W. The threshold value is not necessarily a single value and may be multiple values. In that case, it is possible to perform different impedance matching, e.g., the impedance matching of the present embodiment in which the processing of the wafer W is prior to the impedance matching and an impedance matching in which the impedance matching is prior to the processing of the wafer W, based on the power of the reflection wave.

In the present embodiment, the first state is switched to the second state when the magnetron 31 for generating the microwave in the second state is switched from the off state to the on state in the first state. Further, the duration of the second state is shorter than or equal to a period of time in which the magnetron 31 for generating the microwave in the second state is in an on state in the first state. The duration of the on state of the magnetron 31 to generate the microwave in the second state before and after the switching from the second state to the first state is equal to the above period of time. Hence, in accordance with the present invention, the deterioration of the processing efficiency for the wafer W can be prevented by minimizing the duration of the second state for detecting the reflection wave.

In the microwave processing apparatus and the control method thereof in accordance with the embodiments of the present invention, the microwave is generated only by the microwave source as an impedance matching target in the second state. Therefore, it is possible to accurately detect the reflection wave on the transmission line between the processing chamber and the microwave source as the impedance matching target. As a result, the accuracy of the impedance matching between the microwave source and the processing chamber can be improved.

Hereinafter, other effects of the present embodiment will be described. In the present embodiment, the microwave introducing unit 3 includes a plurality of magnetrons 31 and a plurality of waveguides 32, so that a plurality of microwaves can be introduced into the processing chamber 2 at the same time. In accordance with the present embodiment, even when the output of each magnetron 31 is insufficient for the wafer W, the wafer W can be processed by introducing a plurality of microwaves into the processing chamber 2.

In accordance with the present embodiment, the microwave is irradiated to the wafer W in order to process the wafer W. Therefore, in accordance with the present invention, the wafer W can be processed at a lower temperature compared to the plasma processing.

The present invention is not limited to the above-described embodiment and can be variously modified. For example, the microwave processing apparatus of the present invention is not limited to the case of processing a semiconductor wafer, and can also be applied to the case of processing a substrate of a solar cell panel or a substrate for used in a flat panel display.

Although the example in which the magnetrons 31A and 31B are coupled to the boosting transformer 44A and the magnetrons 31C and 31D are coupled to the boosting transformer 44B has been described in the above-described embodiment, the magnetrons 31A to 31D can be connected to different boosting transformers. In that case, combination of the magnetrons for generating microwaves at the same time among the magnetrons 31A to 31D can be arbitrarily selected.

Further, the number of the microwave units 30 (i.e., the number of the magnetrons 31) or the number of microwaves introduced into the processing chamber 2 simultaneously is not limited to that described in the above embodiment.

While the invention has been shown and described with respect to the embodiments, it will be understood by those skilled in the art that various changes and modification may be made without departing from the scope of the invention as defined in the following claims.

What is claimed is:

1. A microwave processing apparatus comprising:
  a processing chamber accommodating an object to be processed;
  a microwave introducing unit for generating microwaves used to process the object and introducing the microwaves into the processing chamber; and
  a control unit for controlling the microwave introducing unit,
  wherein the microwave introducing unit includes a plurality of microwave sources for generating the microwaves and a plurality of transmission lines for transmitting the microwaves generated by the microwave sources into the processing chamber, and is configured to introduce parts of the microwaves into the processing chamber simultaneously, and
  wherein the control unit is configured to switch a first state in which said parts of the microwaves are simultaneously introduced into the processing chamber to a second state in which a microwave is generated by one of the microwave sources and is introduced into the processing chamber, temporarily and selectively, and to switch the second state to the first state when the second state is completed, and wherein the microwaves are irradiated onto the object, thereby processing the object.

2. The microwave processing apparatus of claim 1, wherein the microwave introducing unit further includes a plurality of detectors for detecting reflection waves from the processing chamber on the transmission lines;

and wherein the first state is a major state for processing the object, and the second state is a state for detecting a reflection wave on a transmission line on which the microwave is generated in the second state among the transmission lines.

3. The microwave processing apparatus of claim 2, wherein the control unit performs impedance matching between the processing chamber and the one of the microwave sources, which generates the microwave in the second state, based on a power of the reflection wave detected in the second state.

4. The microwave processing apparatus of claim 2, wherein the control unit determines the one of the microwave sources, which generates the microwave in the second state, based on powers of the reflection waves detected in the first state.

5. The microwave processing apparatus of claim 1, wherein the microwave sources include a plurality of first microwave sources for alternately repeating a microwave generating state and a microwave non-generating state multiple times in the first state and a plurality of second microwave sources for alternately repeating the microwave generating state and the microwave non-generating state multiple times in the first state while avoiding the simultaneous microwave generations by the first and the second microwave sources.

6. The microwave processing apparatus of claim 5, wherein the first state is switched to the second state when the one of the microwave sources, which generates the microwave in the second state, is switched from the microwave non-generating state to the microwave generating state in the first state.

7. The microwave processing apparatus of claim 6, wherein a duration of the second state is shorter than or equal to a period of time of the microwave generating state in the first state of the one of the microwave sources which generates the microwave in the second state, and wherein a duration of the microwave generating state of the one of the microwave sources, which generates the microwave in the second state, before and after the switching from the second state to the first state is equal to said period of time.

8. A method of controlling the microwave processing apparatus including a processing chamber accommodating an object to be processed and a microwave introducing unit for generating microwaves used to process the object and introducing the microwaves into the processing chamber, wherein the microwave introducing unit has a plurality of microwave sources for generating the microwaves and a plurality of transmission lines for transmitting the microwaves generated by the microwave sources into the processing chamber so that parts of microwaves are simultaneously introduced into the processing chamber, the method comprising:

switching a first state in which said parts of the microwaves are simultaneously introduced into the processing chamber to a second state in which a microwave is generated by one of the microwave sources and is introduced into the processing chamber, selectively and temporarily; and switching the second state to the first state when the second state is completed.

9. The method of claim 8, wherein the microwave introducing unit further includes a plurality of detectors for detecting reflection waves from the processing chamber on the transmission lines, and wherein the first state is a major state for processing the object, and the second state is a state for detecting a reflection wave on a transmission line on which the microwave is generated in the second state among the transmission lines.

10. The method of claim 9, further comprising performing impedance matching between the processing chamber and the one of the microwave sources, which generates the microwave in the second state based on a power of the reflection wave detected in the second state.

11. The method of claim 9, wherein the one of the microwave sources, which generates the microwave in the second state, is determined based on powers of the reflection waves detected in the first state.

12. The method of claim 8, wherein the microwave sources include a plurality of first microwave sources for alternately repeating a microwave generating state and a microwave non-generating state multiple times in the first state and a plurality of second microwave sources for alternately repeating the microwave generating state and the microwave non-generating state multiple times in the first state while avoiding simultaneous microwave generations by the first and the second microwave sources.

13. The method of claim 12, wherein said switching the first state to the second state is performed when the one of the microwave sources, which generates the microwave in the second state, is switched from the microwave non-generating state to the microwave generating state in the first state.

14. The method of claim 13, wherein a duration of the second state is shorter than or equal to a period of time of the microwave generating state in the first state of the one of the microwave sources which generates the microwave in the second state, and wherein a duration of the microwave generating state of the one of the microwave sources, which generates the microwave in the second state, before and after the switching from the second state to the first state is equal to said period of time.

15. The method of claim 8, wherein the microwaves are irradiated onto the object, thereby processing the object.

\* \* \* \* \*